United States Patent [19]

Vandevier

[11] Patent Number: 4,901,070
[45] Date of Patent: Feb. 13, 1990

[54] PRESSURE MONITORING SYSTEM WITH ISOLATING MEANS

[75] Inventor: Joseph E. Vandevier, Claremore, Okla.

[73] Assignee: Baker Hughes Incorporated, Houston, Tex.

[21] Appl. No.: 385,223

[22] Filed: Jul. 25, 1989

[51] Int. Cl.[4] .............................................. G01V 1/00
[52] U.S. Cl. .................................. 340/856; 166/66.4; 417/63; 340/870.16; 340/853
[58] Field of Search ................... 340/853, 856, 870.16, 340/870.17, 870.04; 166/336, 66, 66.4; 417/63, 13, 32

[56] References Cited

U.S. PATENT DOCUMENTS

```
3,284,669  11/1966  Boyd .
4,157,535   6/1979  Balkanli .
4,178,579  12/1979  McGibbeny et al. .
4,477,230  10/1984  Knox et al. ............................ 417/63
4,523,194   6/1985  Hyde .
4,581,613   4/1986  Ward et al. ......................... 340/856
4,631,535  12/1986  Butlin .
4,803,483   2/1989  Vandervier et al. .
```

Primary Examiner—Harold J. Tudor
Assistant Examiner—J. Woodrow Eldred
Attorney, Agent, or Firm—Bradley, James E.

[57] ABSTRACT

An electric submersible pump system has a pressure monitoring device for monitoring the pressure down the hole. The pressure monitoring device has a pressure transducer whose resistance varies with the pressure. The pressure transducer is connected to ground and is supplied with a DC current that is superimposed on the AC power cable. A temperature switch is connected between the pressure transducer and the motor winding. The temperature switch is normally open, and closes when it reaches a selected temperature. The temperature is selected to be above the ambient temperature in the well and below the temperature that occurs when the motor is operating and fully warmed up. The temperature switch isolates the windings from ground when the motor is shut off and cooled down. This enables the motor winding and power cable to be checked for insulation resistance.

3 Claims, 1 Drawing Sheet

PRESSURE MONITORING SYSTEM WITH ISOLATING MEANS

BACKGROUND OF THE INVENTION

1. Field of the Invention:

This invention relates in general to electrically driven centrifugal submersible pumps, and in particular to a pump system that has a pressure monitoring device and also means for isolating the pressure monitoring device from ground so as to allow testing of the insulation resistance of the power cable and motor winding.

2. Description of the Prior Art:

This invention deals with electrical submersible pump systems, particularly those used with oil wells. The pump system has a centrifugal pump with a number of stages located downhole. An electric motor will be coupled to the pump downhole. A power cable with three separate conductors extends from the surface to the pump. Three-phase alternating current (AC) will be supplied from the surface to the motor to drive the pump.

During installation, and also at other times, it is desirable to test the insulation resistance of the motor winding and the power cable. The three phases of the motor winding will be tied together into the three power conductors. High DC voltage will be applied at the surface between the power conductors and ground. If there is any leakage current to ground through the insulation of the power conductors or the motor, then the surface testing device, known as a meggar, will show a resistance below that desired. This megging test indicates the dielectric condition of the insulation system.

Testing for insulation leakage becomes a problem if the pump has a downhole pressure monitoring system of the type that is connected to ground. In this type of system, typically the downhole package will include a pressure transducer whose resistance varies with the pressure. One lead of the pressure transducer will be connected to ground. The other lead will be connected through a filter to the motor windings. At the surface, a measuring means will superimpose a DC voltage or current onto the AC power conductors. A filter at the surface blocks the measuring circuit from the AC power. This DC voltage causes a DC current to pass through the uphole and downhole filters and flow through the pressure transducer to ground. This provides a measurement of the resistance of the pressure transducer and thus an indication of the downhole pressure.

Because the pressure transducer connects to ground, the system cannot be tested for insulation leakage unless the pressure transducer is isolated from the motor windings. In U.S. Pat. No. 4,178,579, a relay is utilized downhole. This relay may be activated by a different voltage transmission than the voltage utilized for the pressure transducer. When activated, the relay disconnects the pressure and temperature monitoring system from the motor winding. This allows the system to be tested for insulation resistance. While workable, a disadvantage is that the relay may malfunction downhole, preventing the pressure and temperature system from working properly.

SUMMARY OF THE INVENTION

In this invention, a temperature actuated switch will be connected in series with a pressure transducer. The switch is of a type that is normally open below a selected temperature and closes above a selected temperature. The temperature will be selected to be at a level that is above the expected downhole well temperature with the motor shut off and cooled to the ambient temperature of the well. This temperature will be below the expected temperature of the switch which occurs when the motor is warmed up and running.

When the pump assembly is first lowered into the well, prior to starting the motor, the switch will be open. This allows the insulation resistance to be tested. Once the motor is started and runs sufficiently to warm up the surrounding fluid, the temperature switch will close. This connects the pressure transducer to the motor windings to enable a pressure reading to be determined at the surface.

DETAILED DESCRIPTION OF THE INVENTION

Figure 1:
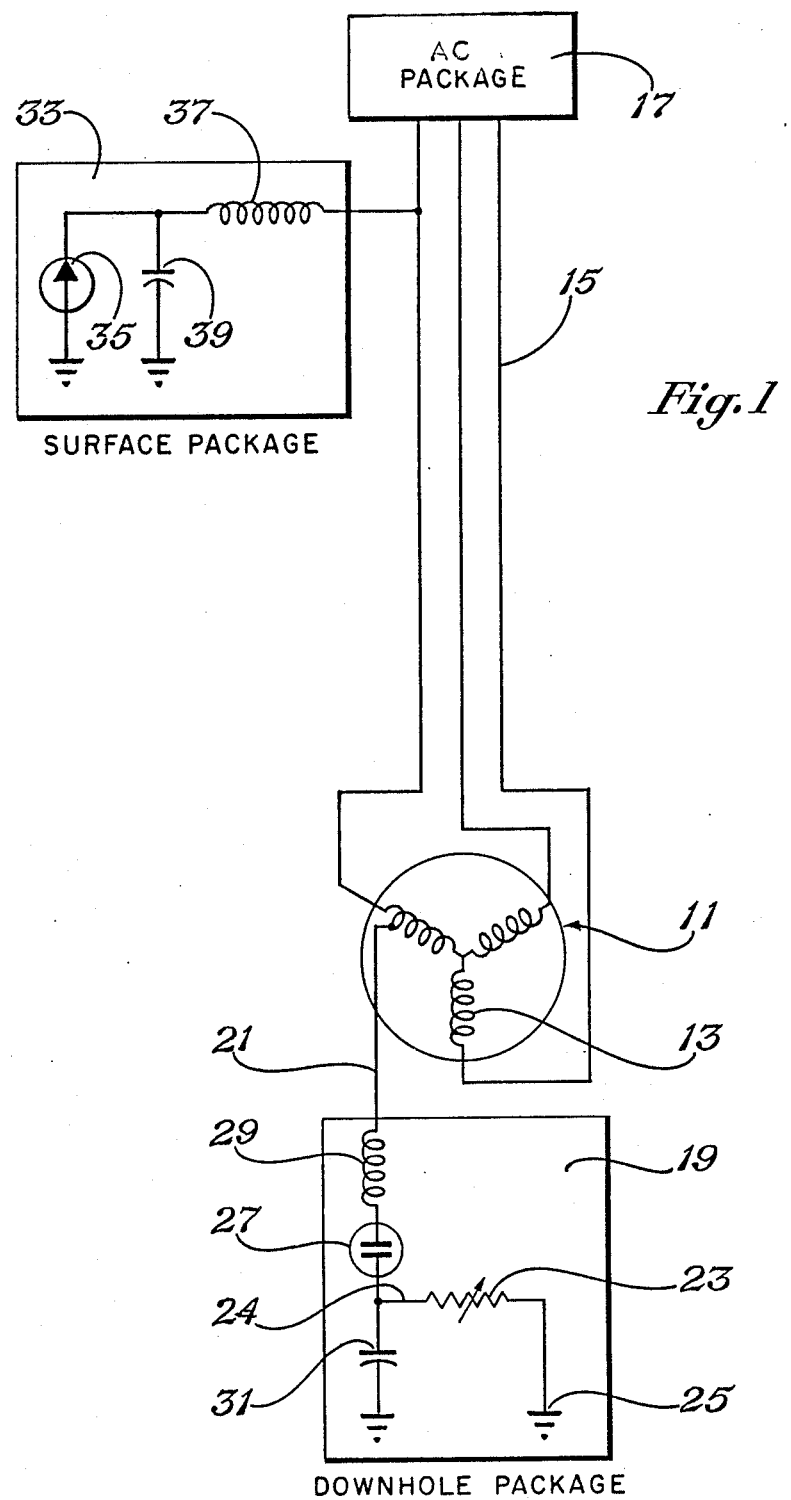
FIG. 1 is the sole FIGURE and it illustrates schematically a pressure monitoring system with isolating means for an electrical submersible pump installation.

Referring to FIG. 1, motor 11 is a downhole, three-phase AC motor of a conventional type. It has three motor windings 13, which are connected in the embodiment shown in a "Y" configuration. Each of the windings 13 will be connected to a power cable which has three separate conductors 15. The three power conductors 15 extend from an AC package 17 at the surface. The AC package 17 includes a source for supplying three-phase alternating current down the power conductors 15 to the motor 11. AC package 17 is conventional, and may comprise a transformer for transforming voltage from utility power lines. In some cases, it may also include a variable speed drive system for varying the frequency of the AC power supplied.

A downhole pressure monitoring package 19 will be connected into the assembly adjacent the motor 11. The downhole package 19 has a lead 21 which is connected to one of the motor windings 13. The downhole package 19 also has a pressure transducer 23 of a conventional type. Pressure transducer 23 has a resistance which varies with pressure. The pressure transducer 23 will be exposed to the downhole pressure. Pressure transducer 23 has one lead which is connected to ground 25.

The downhole pressure monitoring package 19 also has a temperature switch 27 which is connected in series with the pressure transducer 23 below the motor winding 13. The temperature switch 27 is preferably connected to a lead 24 of the pressure transducer 23, while the other lead of transducer 23 is connected to ground. The temperature switch 27 is of a type that is open until it reaches a selected temperature. The temperature switch 27 can have its selected temperature chosen for the particular well into which the system will be installed.

The selected temperature will be set to a point that is below that of the ambient bottom hole temperature of the well. The temperature setting of the temperature switch 27 will be selected so that it will close below the expected operating temperature of the motor 11 while the motor 11 is running. For example, if the ambient bottom hole temperature is 200 degrees, and if the heat generated by the motor 11 will be expected to raise the temperature of the temperature switch 27 from 60 to 120 degrees above the bottom hole ambient temperature, then the temperature switch may be set at about 230 degrees. As a result, the temperature switch will not close and will not allow the downhole package 19 to operate unless the motor has been running long enough to warm the temperature switch 27 up to its closing temperature.

The downhole package 19 also has a conventional filter which comprises an inductor 29 and a capacitor 31. The inductor 29 is connected to the lead 21 and to the temperature switch 27. The capacitor 31 connects between lead 24 and ground. The capacitor 31 and inductor 29 block AC current from the transducer 23, but allow DC current to flow through the transducer 23.

The pressure monitoring system also includes a surface package 33. Surface package 33 will be conventional. It has a conventional measuring circuit 35. The measuring circuit 35 supplies DC current through a blocking filter to one of the power conductors 15. The blocking filter includes an inductor 37 connected in series with the measuring circuit 35. The filter also includes a capacitor 39 connected between the measuring circuit 35 and ground. The inductor 37 and capacitor 39 block AC power from the measuring circuit 35. The measuring circuit 35 also includes means for measuring the amount of current and voltage employed so as to determine the change in resistance of the transducer 23.

In operation, while at the surface, the temperature switch 27 will be set to its selected temperature. That temperature will be above the expected bottom hole temperature of the well. It will be below the operating temperature of motor 11 when warmed up.

The downhole system will then be lowered into the well. Prior to staring the motor, the insulation resistance of the conductors 15 and windings 13 may be tested. This can be handled by a conventional test unit or meggar. The meggar will apply approximately 2500 to 5000 volts DC between the conductors 15 and surface ground. The DC voltage will not flow down the lead 21 because the temperature switch 27 will still be open. This enables the leakage current from the conductors 15 through their insulation to ground and the leakage of the motor windings 13 to ground to be determined. This indicates the dielectric condition of the insulating system, determining if there are any problems.

Then the motor may be started. After the motor warms sufficiently, the temperature switch 27 will rise to its actuating temperature. At that moment, the temperature switch will close. The pressure transducer 23 will now be electrically connected with the lead 21. DC voltage will be supplied through the measuring circuit 35 and superimposed on one of the three power conductors 15. The DC current will flow through the lead 21 and the transducer 23 to ground 25. The inductor 29 and capacitor 31 will block the AC power from the transducer 23. The measuring circuit 35 monitors the current flow to determine the resistance.

Subsequently, if it is desired to test the insulation resistance again, the motor should be shut off and allowed to cool down sufficiently to cause the temperature switch 27 to open again.

The invention has significant advantages. The temperature switch will isolate the pressure transducer from the motor windings. This allows the motor windings and conductors to be tested for insulation resistance. The temperature switch is simple and should be more reliable than a downhole relay.

While the invention has been shown in only one of its forms, it should be apparent to those skilled in the art that it is not so limited, but is susceptible to various changes without departing from the scope of the invention.

I claim:

1. In a submersible pump system having an AC motor located in a well for driving a centrifugal pump, power supply means at the surface for supplying AC power over a power cable having conductors to a motor winding of an AC motor, a downhole pressure transducer of a type which has a resistance which varies with temperature, having one lead electrically connected to ground and another lead electrically connected to the motor winding, measuring means at the surface for superimposing a voltage on one of the power conductors to monitor the resistance of the pressure transducer, an improved means for isolating the motor winding from ground through the pressure transducer to allow testing of the insulation resistance of the conductors and the motor winding, comprising in combination:

a temperature actuated switch connected downhole in series with the pressure transducer, the switch being open below a selected temperature and closed above the selected temperature, the selected temperature being set at a level above the expected downhole well ambient temperature with the motor shut off but below the expected temperature of the switch which occurs when the motor is warmed up and running, thereby isolating the power cable and motor winding from the ground through the pressure transducer while the motor is shut off and at ambient temperature of the well.

2. In a submersible pump system having an AC motor located in a well for driving a centrifugal pump, power supply means at the surface for supplying AC power over conductors to a motor winding of an AC motor, an improved means for measuring downhole pressure, comprising in combination:

a downhole pressure transducer having one lead electrically connected to a ground and another lead electrically connected to the motor winding, the pressure transducer being of a type in which the resistance of the pressure transducer varies with the pressure in the well;

measuring means at the surface for superimposing a DC voltage on one of the power conductors to cause current to flow through the pressure transducer to the ground, and for monitoring the resistance of the pressure transducer;

filter means connected between the pressure transducer and the motor winding for blocking AC power from the pressure transducer; and a temperature actuated switch electrically connected below the motor winding in series with the pressure transducer, the switch being open below a selected temperature and closed above the selected temperature, the selected temperature being set at a level above the expected downhole well ambient temperature with the motor shut off but below the expected temperature of the switch which occurs while the motor is warmed up and running, thereby isolating the power conductors and motor winding from ground through the pressure transducer while the motor is shut off and at the ambient temperature of the well.

3. A method for testing power conductors and motor winding insulation resistance in a submersible pump system of the type having an AC motor located in a well for driving a centrifugal pump, power supply means at the surface for supplying AC power over the conductors to the motor winding of an AC motor, a downhole pressure transducer having one lead electrically connected to ground and another lead electrically connected to the motor winding, measuring means at the surface for superimposing a voltage on one of the power conductors to monitor the resistance of the pressure transducer, which varies with the pressure in the well, the method comprising in combination:

connecting a temperature actuated switch in series with the pressure transducer, the switch being of a type that is open below a selected temperature and closed above the selected temperature;

setting the selected temperature at a level above the expected downhole well ambient temperature with the motor shut off but below the expected temperature of the switch which occurs while the motor is warmed up and running; and while the motor is shut off and the temperature switch open, applying at the surface a DC voltage between the power conductors and the ground and monitoring any insulation leakage current.

* * * * *